USO05592125A

United States Patent [19]
Williams

[11] Patent Number: 5,592,125
[45] Date of Patent: *Jan. 7, 1997

[54] MODIFIED BANG-BANG PHASE DETECTOR WITH TERNARY OUTPUT

[75] Inventor: Bertrand J. Williams, Campbell, Calif.

[73] Assignee: Cypress Semiconductor Corporation, San Jose, Calif.

[ * ] Notice: The term of this patent shall not extend beyond the expiration date of Pat. No. 5,455,540.

[21] Appl. No.: 516,917

[22] Filed: Aug. 18, 1995

Related U.S. Application Data

[63] Continuation of Ser. No. 329,277, Oct. 26, 1994, Pat. No. 5,455,540.

[51] Int. Cl.$^6$ .................................................. H03L 7/085
[52] U.S. Cl. .............................. 331/1 A; 331/25; 327/12; 327/159; 375/376
[58] Field of Search ...................... 331/1 A, 25; 327/12, 327/150, 159; 329/303, 310–313; 360/41, 51; 375/327, 328, 375, 376

[56] References Cited

U.S. PATENT DOCUMENTS

| | | | |
|---|---|---|---|
| 3,610,954 | 10/1971 | Treadway | 307/232 |
| 3,925,614 | 12/1975 | Bousmar | 178/88 |
| 3,938,184 | 2/1976 | DeFrancesco et al. | 360/51 |
| 4,128,812 | 12/1978 | Pavlis | 328/134 |
| 4,218,771 | 8/1980 | Hogge, Jr. | 375/120 |
| 4,330,863 | 5/1982 | Wright | 375/81 |
| 4,339,731 | 7/1982 | Adams | 331/1 A |
| 4,520,489 | 5/1985 | Hogge, Jr. | 375/14 |
| 4,535,459 | 8/1985 | Hogge, Jr. | 375/80 |
| 4,538,283 | 8/1995 | Hogge, Jr. | 375/14 |
| 4,555,789 | 11/1985 | Hogge, Jr. | 375/11 |
| 4,561,098 | 12/1985 | van Tol | 375/49 |

(List continued on next page.)

FOREIGN PATENT DOCUMENTS

| | | |
|---|---|---|
| 2573592 | 5/1986 | France . |
| 2588433 | 4/1987 | France . |

OTHER PUBLICATIONS

Hogge, C. R., Jr., "A Self Correcting Clock Recovery Circuit" *Journal of Lightwave Technology*, vol. LT-3, No. 6, pp. 1312–1314 (Dec. 1985).

Lee, T. H., et al., "A 155–MHz Clock Recovery Delay and Phase Locked Loop" *IEEE Journal of Solid State Circuits*, vol. 27, No. 12, pp. 1736–1746 (Dec. 1992).

Messerschmitt, D. G., "Frequency Detectors for PLL Acquisition in Timing and Carrier Recovery" *IEEE Transactions on Communications*, vol. COM–27, No. 9, pp. 1288–1295 (Sep. 1979).

Llewellyn, W. D., "Session I: High Speed Data Recovery WAM 1.1: A 33 Mb/s Data Synchronizing Phase–Locked–Loop Circuit" *Digest of Technical Papers* IEEE Int'l. Solid–State Circuits Conf., Feb. 17, 1988, pp. 12–13, 276–277 (1988).

Benny Lai & Richard C. Walker, "A Monolithic 622 Mb/s Clock Extraction Data Retiming Circuit" *IEEE*, pp. 144–145, (1991).

Walker, R. C., et al., "A Two–Chip 1.5 GBd Serial Link Interface" *IEEE Journal of Solid–State Circuits*, vol. 27, No. 12, pp. 1805–1810 (Dec. 1992).

Walker, et al., "A 1.5 Gb/s Link Interface Chipset for Computer Data Transmission", *IEEE Journal on Selected Areas in Communications*, vol. 9, No. 5, pp. 698–703 (Jun. 1991).

*Primary Examiner*—David Mis
*Attorney, Agent, or Firm*—Blakely, Sokoloff, Taylor & Zafman

[57] ABSTRACT

A phase detector is described. The phase detector receives a data signal from an external circuit. The phase detector generates a first signal when a transition edge of the clock signal occurs after a transition edge of the data signal. The phase detector generates a second signal when the transition edge of the clock signal occurs before the transition edge of the data signal and generates a third signal when the data signal remains in a same signal state for at least two transition edges of a same type of the clock signal.

4 Claims, 6 Drawing Sheets

U.S. PATENT DOCUMENTS

| | | | |
|---|---|---|---|
| 4,565,976 | 1/1986 | Campbell | 331/57 |
| 4,584,695 | 4/1986 | Wong et al. | 375/81 |
| 4,587,653 | 5/1986 | Hogge, Jr. | 371/6 |
| 4,686,481 | 8/1987 | Adams | 328/133 |
| 4,724,401 | 2/1988 | Hogge, Jr. et al. | 331/4 |
| 4,788,512 | 11/1988 | Hogge, Jr. et al. | 331/4 |
| 4,811,361 | 3/1989 | Bacou et al. | 375/25 |
| 4,821,293 | 4/1989 | Shimizume et al. | 375/81 |
| 4,884,041 | 11/1989 | Walker | 331/57 |
| 4,926,447 | 5/1990 | Corsetto et al. | 375/120 |
| 5,015,970 | 5/1991 | Williams et al. | 331/11 |
| 5,036,298 | 7/1991 | Bulzachelli | 331/23 |
| 5,111,486 | 5/1992 | Oliboni et al. | 375/120 |
| 5,164,966 | 11/1992 | Hershberger | 375/110 |
| 5,260,608 | 11/1993 | Marbot | 307/262 |
| 5,268,937 | 12/1993 | Marbot | 375/121 |
| 5,305,453 | 4/1994 | Boudry et al. | 395/550 |
| 5,315,271 | 5/1994 | Pascual et al. | 331/25 |
| 5,455,540 | 10/1995 | Williams | 331/1 A |

MODIFIED BANG-BANG PHASE DETECTOR WITH TERNARY OUTPUT

This is a continuation of application Ser. No. 08/329,277, filed Oct. 26, 1994, now U.S. Pat. No. 5,455,540.

FIELD OF THE INVENTION

The present invention relates to the field of electrical circuits. More particularly, the present invention relates to the design of phase-locked loop circuits.

BACKGROUND OF THE INVENTION

For the synchronous transmission of digital data for typical systems, a transmitting unit transmits a data signal at a constant rate as determined by a clock local to the transmitting unit, and a receiving unit attempts to receive the data signal at the same constant rate. The transmitting unit may transmit the data signal without a clock signal as the system then requires less than one-half of the bandwidth necessary for the transmission of a data signal with a clock signal. To receive transmitted data signals with minimized errors, then, the receiving unit attempts to recover the clock signal associated with the data signal.

To recover the clock signal, the receiving unit may use a phase-locked loop (PLL) clock recovery system that includes a phase detector and a voltage controlled oscillator (VCO) that controls the frequency of the clock local to the receiving unit. The phase detector detects the phase difference between the received data signal and the clock local to the receiving unit (i.e., phase error), and then modulates the frequency of this local clock to bring the local clock into approximately the same phase and frequency as the received data signal. Thus, PLL circuits are used to maintain the local clock in a specific phase relationship with the received data signal. PLL circuits are used in a wide variety of applications including frequency synthesizers, analog modulators, digital modulators, analog demodulators, digital demodulators, and clock recovery One prior PLL circuit consists of a phase detector that produces an output voltage proportional to the phase difference of the two input signals. The prior PLL circuit also comprises a voltage-controlled-oscillator that produces an ac output signal whose frequency is proportional to the input control voltage. Because the phase detector of the prior PLL circuit produces an output voltage proportional to the phase difference, the PLL circuit utilized linear control of the voltage-controlled-oscillator. However, because of the linear control of the voltage-controlled-oscillator, the prior PLL circuit had a peaking transfer function and exhibited peaking in the passband. The peaking in turn limits the PLL's noise filtering characteristics.

Another prior PLL circuit consists of a phase detector that produces an output voltage independent of the magnitude of the phase difference of the two input signals. The phase detector either produces a high voltage potential which accelerates the clock signal coming out of the voltage-controlled-oscillator or produces a low voltage potential which delays the clock signal coming out of the voltage-controlled-oscillator. As such, the phase detector produces a digital signal to control the voltage-control-oscillator. Because the output voltage of the phase detector is not proportional to the phase difference, this technique is characterized as nonlinear control of the voltage-controlled-oscillator. The nonlinear characteristic of the PLL circuit gives it a non-peaking transfer function and eliminates peaking in the passband. However, the PLL circuit has relatively poor run-length tolerance and introduces jitter (noise) into the system.

Thus, what is needed is a PLL circuit with a non-peaking transfer function, enhanced run-length tolerance and improved jitter performance.

SUMMARY OF THE INVENTION

A novel phase detector is described. The phase detector generates a clock signal, receives a data signal from an external circuit, generates a first signal when a transition edge of the clock signal occurs after a transition edge of the data signal, generates a second signal when the transition edge of the clock signal occurs before the transition edge of the data signal, and generates a third signal when the data signal remains in a same signal state for at least two transition edges of a same type of the clock signal. The phase detector can also generate a first signal state when the transition edge of the data signal occurs and generate a second signal state when the data signal remains in the same signal state for at least two transition edges of a same type of the clock signal. In addition, the phase detector can generate a first signal state when the transition edge of the data signal occurs before the transition edge of the clock signal and generate a second signal state when the transition edge of the data signal occurs after the transition edge of the clock signal.

The phase detector can comprise a data input allowing the phase detector to receive a data signal from a data signal source, a clock input allowing the phase detector to receive a clock signal from a clock signal source, first circuitry coupled to the data input and the clock input operable to indicate a transition edge of the data signal, and second circuitry coupled to the data input and the clock input operable to indicate a position of the transition edge of the data signal relative to a transition edge of the clock signal. The phase detector can also comprise third circuitry coupled to the first circuitry and the second circuitry operable to generate a first signal when the transition edge of the clock signal occurs after the transition edge of the data signal. The third circuitry is operable to generate the second signal when the transition edge of the clock signal occurs before the transition edge of the data signal and the third circuitry is operable to generate the third signal when the data signal remains in a same signal state for at least two transition edges of a same type of the clock signal.

A phase-locked loop circuit is also described. The phase-locked loop circuit comprises a clock generator operable to accelerate a clock signal in response to a first signal, operable to delay the clock signal in response to a second signal, and operable to maintain the clock signal in response to a third signal, a phase detector coupled to the clock generator operable to generate the first signal when a transition edge of the clock signal occurs after a transition edge of a data signal and a data input coupled to the phase detector allowing the phase detector to receive the data signal from an external circuit. The phase detector is also operable to generate the second signal when the transition edge of the clock signal occurs before the transition edge of the data signal and is operable to generate the third signal when the data signal remains in a same signal state for at least two transition edges of a same type of the clock signal.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
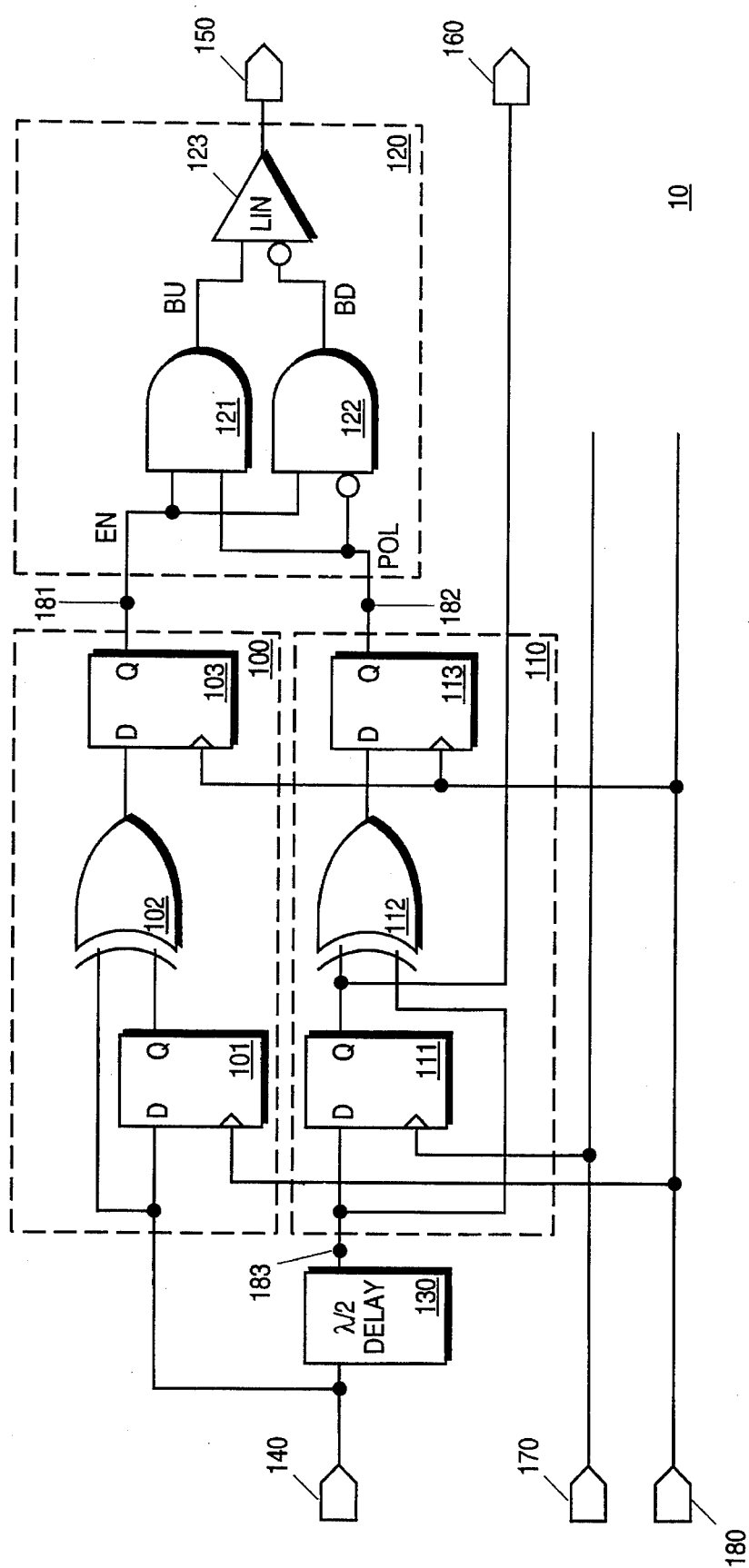
FIG. 1 illustrates in logic diagram form a ternary phase detector for reduced jitter clock recovery.

A novel phase detector is described. In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

For the synchronous transmission of digital data for a system, a transmitting unit transmits a data signal at a constant rate as determined by a clock local to the transmitting unit, and a receiving unit attempts to receive the data signal at the same constant rate. The transmitting unit transmits the data signal without a clock signal. To receive transmitted data signals with minimized errors, the receiving unit attempts to recover the clock signal associated with the data signal.

To recover the clock signal, the receiving unit may use a phase-locked loop (PLL) clock recovery system that includes a phase detector and a voltage controlled oscillator (VCO) that controls the frequency of the clock local to the receiving unit, or local clock. Unless otherwise specified, the term local clock includes the clock local to the receiving unit. The phase detector detects the phase difference between the received data signal and the local clock (i.e., phase error), and then modulates the frequency of the local clock to bring the local clock into approximately the same phase and frequency as the received data signal.

To modulate the frequency of the local clock, the phase detector generates and outputs a pump-up pulse on a pump-up node and a pump-down pulse on a pump-down node. The frequency of the local clock is increased by a pump-up pulse and is decreased by a pump-down pulse. The pump-up pulse or pump-down pulse may be used directly or indirectly as a control signal for the voltage controlled oscillator (VCO) to control the frequency of the local clock.

The phase detector may modulate the frequency of the local clock for each transition edge in the data signal. The transition edge in the data signal includes an edge formed by a transition between a high or logical-one data signal and a low or logical-zero data signal, or vice versa. If the frequency of the local clock needs to be increased, the phase detector generates a pump-up pulse to increase the clock frequency. If the frequency of the local clock needs to be decreased, the phase detector generates a pump-down pulse to decrease the clock frequency. In this manner, the receiving unit synchronizes its local clock to minimize errors in receiving transmitted data.

When the local clock is synchronized with the transmitted data signals, the phase detector is balanced. The phase detector may be balanced when the phase error between the local clock and a received data signal is approximately zero. That is, a transition edge of the data signal to be sampled is aligned with a transition edge of the local clock.

In addition, when there is a long period interval between transition edges, the ideal phase detector generates neither a pump-up pulse nor a pump-down pulse and the frequency of the local clock is neither increased nor decreased. Thus, the phase detector maintains the frequency of the local clock. During a long period interval between transition edges, no comparison of the data transition edges to the clock transition edges can be made and any phase detector output would likely introduce error.

FIG. 1 illustrates in logic diagram form a ternary phase detector for reduced jitter clock recovery. The phase detector of FIG. 1 comprises circuitry 100, 110, and 120 and delay circuitry 130.

For the phase detector of FIG. 1, a data signal is received on node 140 from a transmitting unit. The input node of circuitry 100 is coupled to node 140. The output node of circuitry 100, node 181, is coupled to the input node of circuitry 120. The output node of circuitry 120 is node 150. The input node of delay circuitry 130 is coupled to node 140. The output node of delay circuitry 130, node 183, is coupled to the input node of circuitry 110. The output nodes of circuitry 110 are nodes 160 and 182. The data signal received on node 140 is recovered on node 160.

Circuitry 100 detects a transition edge in the data signal on node 140 and outputs to circuitry 120 a pulse on node 181 indicating the presence of the transition edge. Additionally, delay circuitry 130 delays the data signal on node 140 and outputs the delayed data signal on node 183. For one embodiment, the propagation delay of delay circuitry 130 may be, for example, equal to approximately one-half of the period of the clock local to the transmitting unit. Circuitry 110 samples the delayed data signal on node 183 and outputs the sampled data signal on node 160. Circuitry 110 also detects a transition edge in the delayed data signal on node 183 and outputs on node 182 an output signal indicative of phase. Circuitry 120, in response to the pulse on node 181 and the signal on node 182, outputs on node 150 either a positive pulse, a negative pulse or no pulse.

Because of delay circuitry 130, circuitry 100 detects a transition edge in the data signal received on node 140 relatively earlier than circuitry 110. As both the pulse on node 181 and the output signal on node 182 are generated in response to the transition edge on node 140, delay circuitry 130 determines when the output signal on node 182 is generated with respect to when the pulse is generated on node 181. Circuitry 100 may output on node 181 the pulse indicating the presence of a transition edge while circuitry 110 may simultaneously output on node 182 the signal indicative of phase. The output signal on node 182 is, with this design, logically generated to overlap in time with the pulse on node 181. The term overlap includes a partial overlap, a full or complete overlap, and an exact or substantially exact overlap, for example, as in this case where clock edges simultaneously accomplish this overlap.

Circuitry 100 comprises D-type flip-flop 101, exclusive-OR (XOR) gate 102 and D-type flip-flop 103. The D, C, and Q terminals of D-type flip-flop 101 are respectively coupled to node 140, node 180, and the second input terminal of XOR gate 102. Node 180 is coupled to the logical inversion of the local clock. The first input terminal of XOR gate 102 is coupled to node 140. The output terminal of XOR gate 102 is coupled to the D terminal of D-type flip-flop 103. The C and Q terminals of D-type flip-flop 103 are respectively coupled to node 180 and node 181.

D-type flip-flop 101 is clocked off the appropriate edge, for example the rising edge, of the logical inversion of the local clock and samples or retimes the data signal received on node 140. XOR gate 102 exclusive-ORs the data signal on node 140 with the sampled or retimed data signal on the Q terminal of D-type flip-flop 101. XOR gate 102 as a result outputs a pulse for each transition edge in the data signal on node 140. The pulse has a rising transition edge determined by the transition edge in the data signal on node 140 and a falling transition edge determined by the transition edge in the sampled data signal from D-type flip-flop 101. Thus, the pulse width is set by the spacing between the transition edge in the data signal on node 140 and the transition edge in the sampled data signal from D-type flip-flop 101. XOR gate 102 outputs a pulse of known plurality after every transition edge on node 140 that is independent of the transition edge polarity. For one embodiment, the width of the pulse is approximately one-half the clock period of the local clock when the phase detector of FIG. 1 is balanced or near balanced. D-type flip-flop 103 is clocked off the appropriate edge, for example the rising edge, of the logical inversion of the local clock and samples or retimes the signal received from XOR gate 102. D-type flip-flop 103 as a result outputs on node 181 a pulse of known polarity after every edge transition on node 140 that is independent of the transition edge polarity. The pulse from D-type flip-flop 103 is delayed by approximately one-half clock cycle from the transition edge on node 140.

Circuitry 110 comprises D-type flip-flop 111, XOR gate 112 and D-type flip-flop 113. The D, C, and Q terminals of D-type flip-flop 111 are respectively coupled to node 183, node 170, and the first input terminal of XOR gate 112. Node 170 is coupled to the local clock. The second input terminal of XOR gate 112 is coupled to node 183. The output terminal of XOR gate 112 is coupled to the D terminal of D-type flip-flop 113. The C and Q terminals of D-type flip-flop 113 are respectively coupled to node 180 and node 182. Node 180 is coupled to the logical inversion of the local clock.

D-type flip-flop 111 is clocked off the appropriate edge, for example the rising edge, of the local clock and samples or retimes the delayed data signal received on node 183. D-type flip-flop 111 outputs this sample data signal as the recovered data signal for the data signal received on node 140. D-type flip-flop 111 also outputs the sampled data signal to the first input terminal of XOR gate 112. XOR gate 112 exclusive-ORs the delayed data signal on node 183 with the sampled or retimed data signal on the Q terminal of D-type flip-flop 111. XOR gate 112 as a result outputs a pulse for each transition edge in the delayed data signal on node 183. The pulse has a rising transition edge determined by the transition edge in the delayed data signal on node 183 and a falling transition edge determined by the transition edge in the sampled data signal from D-type flip-flop 111. Thus, the pulse width is set by the spacing between the transition edge in the delayed data signal on node 183 and the transition edge in the sampled data signal from D-type flip-flop 111. XOR gate 112 outputs a pulse of known polarity after every transition edge on node 183 (and thus, node 140) that is independent of the transition edge polarity. However, the width of the pulse is dependent on the location of transition edge of the data signal relative to the transition edge of the local clock. When the transition edge of the data signal occurs before the transition edge of the local clock, the width of the pulse is greater than one-half clock period. On the other hand, when the transition edge of the data signal occurs after the transition edge of the local clock, the width of the pulse is less than one-half clock period. D-type flip-flop 113 is clocked off the appropriate edge, for example the rising edge, of the logical inversion of the local clock and samples or retimes the signal received from XOR gate 112. D-type flip-flop 113 as a result outputs on node 181 a first signal state e.g. a logical-one when the pulse from XOR gate 112 rises before the falling transition edge of the local clock. D-type flip-flop 113 outputs a second signal state e.g. a logical-zero when the pulse from XOR gate 112 rises after the falling transition edge of the local clock or when no pulse exists near the falling transition edge of the local clock (no transition edge in the data signal).

Circuitry 120 comprises AND gate 121, AND gate 122 and buffer 123. The first input terminal of AND gate 121 is coupled to node 181 and the second input terminal of AND gate 121 is coupled..to node 182. The output terminal of AND gate 121 is coupled to the first input terminal of buffer 123. The first input terminal of AND gate 122 is coupled to node 181 and the second input terminal of AND gate 122 is coupled to node 182. The output terminal of AND gate 122 is coupled to the second input terminal of buffer 123. The output terminal of buffer 123 is coupled to node 150.

AND gate 121 ands the signal on node 181 with the signal on node 182. AND gate 121 as a result outputs a logical-one when a logical-one appears on node 182 while a pulse (logical-one) is on node 181. This condition is satisfied when a transition edge of the data signal occurs before the rising transition edge of the local clock. AND gate 121 outputs a logical-zero when a logical-zero appears on node 182 while a pulse (logical-one) is on node 181. This condition is satisfied when a transition edge of the data signal occurs after the rising transition edge of the local clock. AND gate 121 also outputs a logical-zero when no pulse appears (logical-zero) on node 181. This condition is satisfied when no transition edge of the data signal occurs.

AND gate 122 ands the signal on node 181 with the signal on node 182. AND gate 122 as a result outputs a logical-zero when a logical-one appears on node 182 while a pulse (logical-one) is on node 181. This condition is satisfied when a transition edge of the data signal occurs before the rising transition edge of the local clock. AND gate 122 outputs a logical-one when a logical-zero appears on node 182 while a pulse (logical-one) is on node 181. This condition is satisfied when a transition edge of the data signal occurs after the rising transition edge of the local clock. AND gate 122 outputs a logical-zero when no pulse appears (logical-zero) on node 181. This condition is satisfied when no transition edge of the data signal occurs.

Buffer 123 receives the output of AND gate 121 and AND gate 122. Buffer 123 outputs a first voltage potential when AND gate 121 outputs a logical-one and AND gate 122 outputs a logical-zero. Buffer 123 outputs a second voltage potential when AND gate 121 outputs a logical-zero and AND gate 122 outputs a logical-one. Buffer 123 outputs a third voltage potential when AND gate 121 outputs a logical-zero and AND gate 122 also outputs a logical-zero.

Circuitry 100, 110 and 120 may comprise other suitable circuitry. For example, the D-type flip-flops may be replaced with suitable latching or sample-and-hold storage circuitry, for example. Additionally, the logic gates may include bipolar gates, CML/ECL gates, CMOS gates, or other suitable logic circuit technology.

Figure 2:
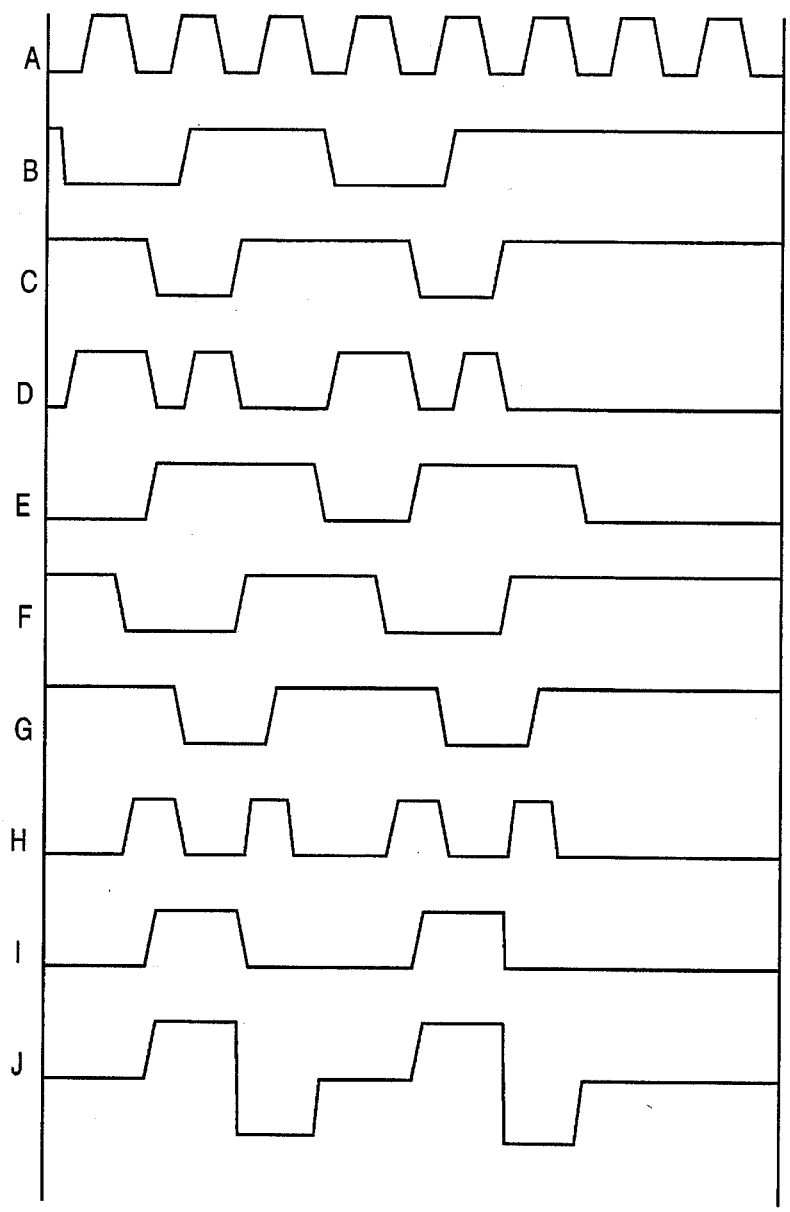
FIG. 2 illustrates in waveform diagram form the operation of the phase detector of FIG. 1.

FIG. 2 illustrates in waveform diagram form the operation of the phase detector of FIG. 1. Waveforms A, B, C, D, E, F, G, H, I and J respectively represent the signals on the local clock, node 140, the Q terminal of D-type flip-flop 101, the output of XOR gate 102, node 181, node 183, the Q terminal of D-type flip-flop 111, the output of XOR gate 112, node 182 and node 150. FIG. 2 illustrates waveforms for the phase detector of FIG. 1 when the transition edge of the data signal on node 140 is first slightly ahead of the transition edge of the local clock, then slightly behind of the transition edge of the local clock, then slightly ahead of the transition edge of the local clock, then slightly behind of the transition edge of the local clock.

As illustrated in FIG. 2, when a transition edge is detected in the data signal on node 140 (waveform B), circuitry 100 outputs on node 181 a pulse after the transition edge of the data signal that is independent of the transition edge polarity (waveform E). The pulse has a width of approximately one clock period. Circuitry 110 outputs on node 182 a first signal state e.g. a logical-one, after the transition edge of the data signal when the transition edge of the data signal is ahead of the transition edge of the local clock and outputs a second signal state e.g. a logical-zero, when the transition edge of the data signal is behind the transition edge of the local clock (waveform I). Circuitry 120 receives the signals on node 181 and node 182, combines the signals, and outputs on node 150 a pump-up pulse, a pump-down pulse or no pulse (waveform J). Circuitry 120 outputs on node 150 a pump-up pulse when the transition edge of the data signal is ahead of the transition edge of the local clock, a pump-down pulse when the transition edge of the data signal is behind the transition edge of the local clock and no pulse when no transition edge of the data signal exists. The pump-up pulse and the pump-down pulse have a width of approximately one clock period.

Delay circuitry 130 delays the data signal on node 140 (waveform B) and outputs on node 183 the delayed data signal (waveform F). When a transition edge is detected in the delayed data signal on node 183 (waveform F), circuitry 110 outputs on node 182 a first signal state (logical-one) or second signal state (logical-zero) indicative of phase (waveform I). Each signal state has a duration of approximately one clock period.

When a transition edge is detected in the data signal on node 140 (waveform B), the phase detector of FIG. 1 generates a pump-up pulse when the transition edge of the data signal is ahead of the transition edge of the local clock, a pump-down pulse when the transition edge of the data signal is behind the transition edge of the local clock and no pulse when no transition edge of the data signal exists.

Waveform C refers to the sampled or retimed data signal on the Q terminal of D-type flip-flop 101. Because D-type flip-flop 101 is clocked off the falling transition edge of the local clock and because the transition edge of data signal occurs near the rising transition edge of the local clock, the sampled data signal from D-type flip-flop 101 resembles the data signal on node 140 except that it is delayed by approximately one-half clock period.

Waveform D refers to the output signal of XOR gate 102. XOR gate 102 exclusive-ORs the data signal on node 140 with the sampled data signal from D-type flip-flop 101. In the example illustrated, with the transition edge of the data signal occurring near the rising transition edge of the local clock, XOR gate 102 outputs a pulse for each transition edge in the data signal because the sampled data signal from D-type flip-flop 101 is a one-half clock period delayed version of the data signal. Each pulse is generated shortly after each transition edge of the data signal and has a pulse width of approximately one-half clock period.

Waveform E refers to the sampled or retimed data signal on the Q terminal of D-type flip-flop 103. D-type flip-flop 103 is clocked off the failing transition edge of the local clock and outputs a pulse for each pulse generated by XOR gate 102. The pulse from D-type flip-flop 103 has a pulse width of approximately one clock period and begins near the falling transition edge of the pulse from XOR gate 102. Thus, the pulse from D-type flip-flop 103 is delayed by one-half clock period when compared to the pulse from XOR gate 102. When compared to the data signal on node 140, the pulse from D-type flip-flop 103 is generated one-half clock period after each transition edge in the data signal. However as shown in the example, only one pulse from D-type flip-flop 103 is generated for two transition edges. In the example, the falling transition edge and the rising transition edge of the data signal are spaced one clock period apart. Thus, because D-type flip-flop 103 is clocked off once every clock period during the falling transition edge of the local clock, the two pulses of one clock period each in effect becomes combined into one pulse of two clock periods. In the situation where the falling transition edge and the rising transition edge of the data signal are spaced two or more clock periods apart, D-type flip-flop 103 generates two distinct pulses of one clock period each. In this manner, D-type flip-flop 103 generates a pulse when the phase detector receives a transition edge in the data signal.

In addition, as illustrated in the example, when the data signal remains in the same signal state for two falling transition edges of the local clock or more, a gap of at least one clock period appears between pulses from XOR gate 102 and a gap appears between pulses from D-type flip-flop 103.

Waveform F refers to the delayed data signal from delay circuit 130. Delay circuit 130 outputs a delayed data signal with a one-half clock period delay. Delay circuit 130 is used to align the output signal from circuitry 100 with the output signal from circuitry 110.

Waveform G refers to the sampled or retimed data signal on the Q terminal of D-type flip-flop 111. D-type flip-flop 111 is clocked off during the rising transition edge of the local clock and in the example illustrated, the sampled data signal of D-type flip-flop 111 resembles the delayed data signal of delay circuit 130 except that it is delayed by another one-half clock period.

Waveform H refers to the output signal of XOR gate 112. XOR gate 112 exclusive-ORs the delayed data signal from delay circuit 130 and the sampled data signal from D-type flip-flop 111. In the example illustrated, with the transition edge of the data signal occurring near the rising transition edge of the local clock, XOR gate 112 outputs a pulse for each transition edge in the data signal because the sampled data signal from D-type flip-flop 111 is a one-half clock period delayed version of the delayed data signal from delay circuit 130. Each pulse is generated shortly after each transition edge of the delayed data signal from delay circuit 130 (one-half clock period after each transition edge of the data signal) and has a pulse width of approximately one-half clock period when the transition edge of the data signal occurs near the rising transition edge of the local clock.

Waveform I refers to the sampled or retimed data signal on the Q terminal of D-type flip-flop 113. D-type flip-flop 113 is clocked off during the falling transition edge of the local clock and generates a first signal state e.g. a logical-one when the pulse from XOR gate 112 rises before the falling transition edge of the local clock. D-type flip-flop 113 generates a second signal state e.g. a logical-zero when the pulse from XOR gate 112 rises after the falling transition edge of the local clock or when no pulse exists near the falling transition edge of the local clock. Because the rising transition edge of the pulse signal from XOR gate 112 is derived from the transition edge of the data signal as reflected in the transition edge of the delayed data signal from delay circuit 130, when the transition edge of the data signal occurs before the rising transition edge of the local clock, D-type flip-flop 113 generates a first signal state. Likewise, when the transition edge of the data signal occurs after the rising transition edge of the local clock, D-type flip-flop 113 generates a second signal state. In this manner, D-type flip-flop 113 generates a first signal state when the transition edge of the data signal occurs before the rising transition edge of the local clock and generates a second signal state when the transition edge of the data signal occurs after the rising transition edge of the local clock.

Waveform J refers to the output signal of circuitry 120. When circuitry 100 outputs a pulse, circuitry 120 outputs a first voltage potential, when circuitry 110 also outputs a first signal state. When circuitry 110 outputs a second signal state while circuitry 100 outputs a pulse, circuitry 120 outputs a second voltage potential. On the other hand, when circuitry 100 does not output a pulse, circuitry 120 outputs a third voltage potential regardless of the output of circuitry 110. In this manner, circuitry 120 generates a first voltage potential when the transition edge of the data signal occurs before the rising transition edge of the local clock, generates a second voltage potential when the transition edge of the data signal occurs after the rising transition edge of the local clock, and generates a third voltage potential when the data signal remains in the same signal state for two falling transition edges of the local clock or more.

Figure 3:
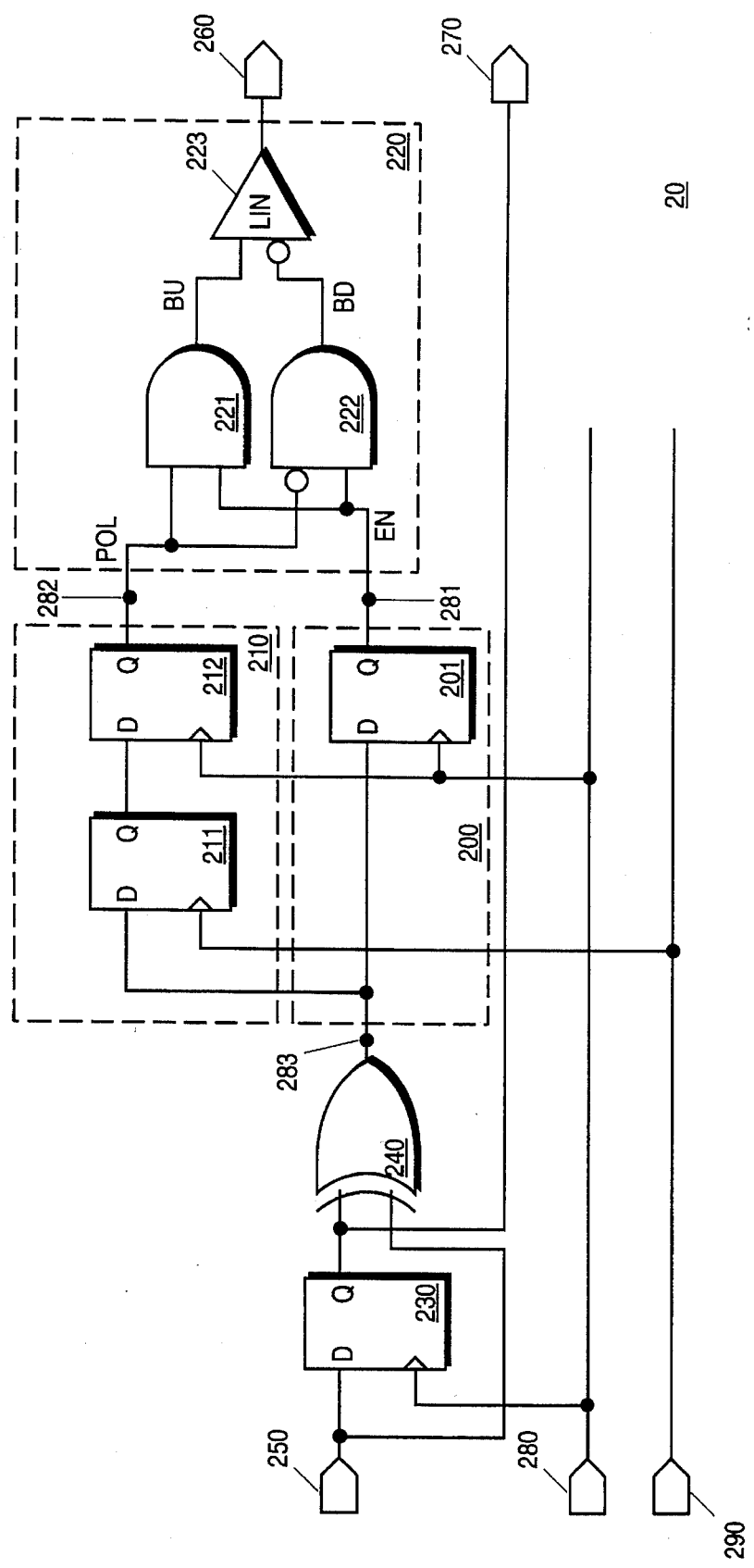
FIG. 3 illustrates in logic diagram form a phase detector of a second embodiment of the present invention.

FIG. 3 illustrates in logic diagram form a phase detector of a second embodiment of the present invention. The phase detector of FIG. 3 comprises circuitry 200, circuitry 210, circuitry 220, D-type flip-flop 230 and XOR gate 240.

For the phase detector of FIG. 3, a data signal is received on node 250 from a transmitting unit. The D, C, and Q terminals of D-type flip-flop 230 are respectively coupled to node 250, node 280 and the first input terminal of XOR gate 240. Node 280 is coupled to the local clock. The second input terminal of XOR gate 240 is coupled to node 250. The output terminal of OR gate 240 is coupled to node 283. The input node of circuitry 200 is coupled to node 283 and the input node of circuitry 210 is also coupled to node 283. The output node of circuitry 200, node 281, is coupled to the first input node of circuitry 220. The output node of circuitry 210, node 282, is coupled to the second input node of circuitry 220. The output node of circuitry 220 is node 260. The data signal received on node 250 is recovered on node 270 which is in turn coupled to the Q terminal of D-type flip-flop 230.

D-type flip-flop 230 and XOR gate 240 together detect a transition edge in the data signal on node 250 and output a pulse in response to the transition edge. Circuitry 200 detects the pulse on node 283 created by the transition edge in the data signal on node 250 and outputs to circuitry 220 a pulse on node 281 indicating the presence of the transition edge. Circuitry 210 also detects a pulse on node 283 created by a transition edge in the data signal on node 250 and outputs to circuitry an output signal indicative of phase. Circuitry 220, in response to the pulse on node 281 and the signal on node 282, outputs on node 260 either a positive pulse, a negative pulse or no pulse.

D-type flip-flop 230 is clocked off the appropriate edge, for example the rising edge, of the local clock and samples or retimes the data signal received on node 250. D-type flip-flop 230 outputs this sampled data signal to node 270 as the recovered data signal for the data signal received on node 250. D-type flip-flop 230 also outputs the sampled data signal to the first input terminal of XOR gate 240. XOR gate 240 exclusive-ORs the data signal on node 250 with the sampled or retimed data signal on the Q terminal of D-type flip-flop 230. XOR gate 240 as a result outputs a pulse for each transition edge in the data signal on node 250. The pulse has a rising transition edge determined by the transition edge in the data signal on node 250 and a falling transition edge determined by the transition edge in the sampled data signal from D-type flip-flop 230. Thus, the pulse width is set by the sparing between the transition edge in the data signal on node 250 and the transition edge in the sampled data signal from D-type flip-flop 230. XOR gate 240 outputs a pulse of known polarity after every transition edge on node 250 that is independent of the transition edge polarity. However, the width of the pulse is dependent on the location of transition edge of the data signal relative to the transition edge of the local clock. When the transition edge of the data signal occurs before the falling transition edge of the local clock, the width of the pulse is greater than one-half clock period. On the other hand, when the transition edge of the data signal occurs after the falling transition edge of the local clock, the width of the pulse is less than one-half clock period. Circuitry 200 comprises D-type flip-flop 201. The D, C, and Q terminals of D-type flip-flop 201 are respectively coupled to node 283, node 280, and node 281. Node 280 is coupled to the local clock. D-type flip-flop 201 is clocked off the appropriate edge, for example the rising edge, of the local clock and samples or retirees the signal received from XOR gate 240. D-type flip-flop 201 as a result outputs on node 281 a pulse of known polarity after every edge transition on node 250 that is independent of the transition edge polarity. The pulse from D-type flip-flop 201 is delayed by approximately one-hi clock cycle from the transition edge on node 250.

Circuitry 210 comprises D-type flip-flop 211 and D-type flip-flop 212. The D, C, and Q terminals of D-type flip-flop 211 are respectively coupled to node 283, node 290, and the D terminal of D-type flip-flop 212. Node 290 is coupled to the logical inversion of the local clock. The C and Q terminals of D-type flip-flop 212 are respectively coupled to node 280 and node 282. Node 280 is coupled to the local clock.

D-type flip-flop 211 is clocked off the appropriate edge, for example the rising edge, of the logical inversion of the local clock and samples or retimes the signal received from XOR gate 240. D-type flip-flop 211 as a result outputs a first signal state e.g. a logical-one when the pulse from XOR gate 240 rises before the falling transition edge of the local clock. D-type flip-flop 211 outputs a second signal state e.g. a logical-zero when the pulse from XOR gate 240 rises after the falling transition edge of the local clock or when no pulse exists near the falling transition edge of the local clock (no transition edge in the data signal).

D-type flip-flop 212 is clocked off the appropriate edge, for example the rising edge, of the local clock and samples or retirees the signal received from D-type flip-flop 211. D-type flip-flop 212 as a result outputs a first signal state e.g. a logical-one when D-type flip-flop 211 outputs a first signal state. This condition occurs when the pulse from XOR gate 240 rises before the falling transition edge of the local clock. D-type flip-flop 212 outputs a second signal state e.g. a logical-zero when D-type flip-flop 211 outputs a second signal state. This condition occurs when the pulse from XOR gate 240 rises after the falling transition edge of the local clock or when no pulse exists near the falling transition edge of the local clock (no transition edge in the data signal). The output signal of D-type flip-flop 212 resembles the output of D-type flip-flop 211 except that it is delayed by approximately one-half clock period. As both the pulse on node 281 and the output signal on node 282 are generated in response to the transition edge on node 250, D-type flip-flop 212 determines when the output signal on node 282 is generated with respect to when the pulse is generated on node 281. In this manner, D-type flip-flop 212 compensates for circuitry 200 detecting a transition edge in the data signal received on node 250 relatively earlier than circuitry 210. Circuitry 200 may output on node 281 the pulse indicating the presence of a transition edge while circuitry 210 may simultaneously output on node 282 the signal indicative of phase. The output signal on node 282 is generated to overlap in time with the pulse on node 281.

Circuitry 220 comprises AND gate 221, AND gate 222 and buffer 223. The first input terminal of AND gate 221 is coupled to node 282 and the second input terminal of AND gate 221 is coupled to node 281. The output terminal of AND gate 221 is coupled to the first input terminal of buffer 223. The first input terminal of AND gate 222 is coupled to node 282 and the second input terminal of AND gate 222 is coupled to node 281. The output terminal of AND gate 222 is coupled to the second input terminal of buffer 223. The output terminal of buffer 223 is coupled to node 260.

AND gate 221 ands the signal on node 281 with the signal on node 282. AND gate 221 as a result outputs a logical-one when a logical-one appears on node 282 while a pulse (logical-one) is on node 281. This condition is satisfied when a transition edge of the data signal occurs before the rising transition edge of the local clock. AND gate 221 outputs a logical-zero when a logical-zero appears on node 282 while a pulse (logical-one) is on node 281. This condition is satisfied when a transition edge of the data signal occurs after the rising transition edge of the local clock. AND gate 221 also outputs a logical-zero when no pulse appears (logical-zero) on node 281. This condition is satisfied when no transition edge of the data signal occurs.

AND gate 222 ands the signal on node 281 with the signal on node 282. AND gate 222 as a result outputs a logical-zero when a logical-one appears on node 282 while a pulse (logical-one) is on node 281. This condition is satisfied when a transition edge of the data signal occurs before the rising transition edge of the local clock. AND gate 222 outputs a logical-one when a logical-zero appears on node 282 while a pulse (logical-one) is on node 281. This condition is satisfied when a transition edge of the data signal occurs after the rising transition edge of the local clock. AND gate 222 outputs a logical-zero when no pulse appears (logical-zero) on node 281. This condition is satisfied when no transition edge of the data signal occurs.

Buffer 223 receives the output of AND gate 221 and AND gate 222. Buffer 223 outputs a first voltage potential when AND gate 221 outputs a logical-one and AND gate 222 outputs a logical-zero. Buffer 223 outputs a second voltage potential when AND gate 221 outputs a logical-zero and AND gate 222 outputs a logical-one. Buffer 223 outputs a third voltage potential when AND gate 221 outputs a logical-zero and AND gate 222 also outputs a logical-zero.

Circuitry 200, 210 and 220 may comprise other suitable circuitry. For example, the D-type flip-flops may be replaced with suitable latching or sample-and-hold storage circuitry, for example. Additionally, the logic gates may include bipolar gates, CML/ECL gates, CMOS gates, or other suitable logic circuit technology.

Figure 4:
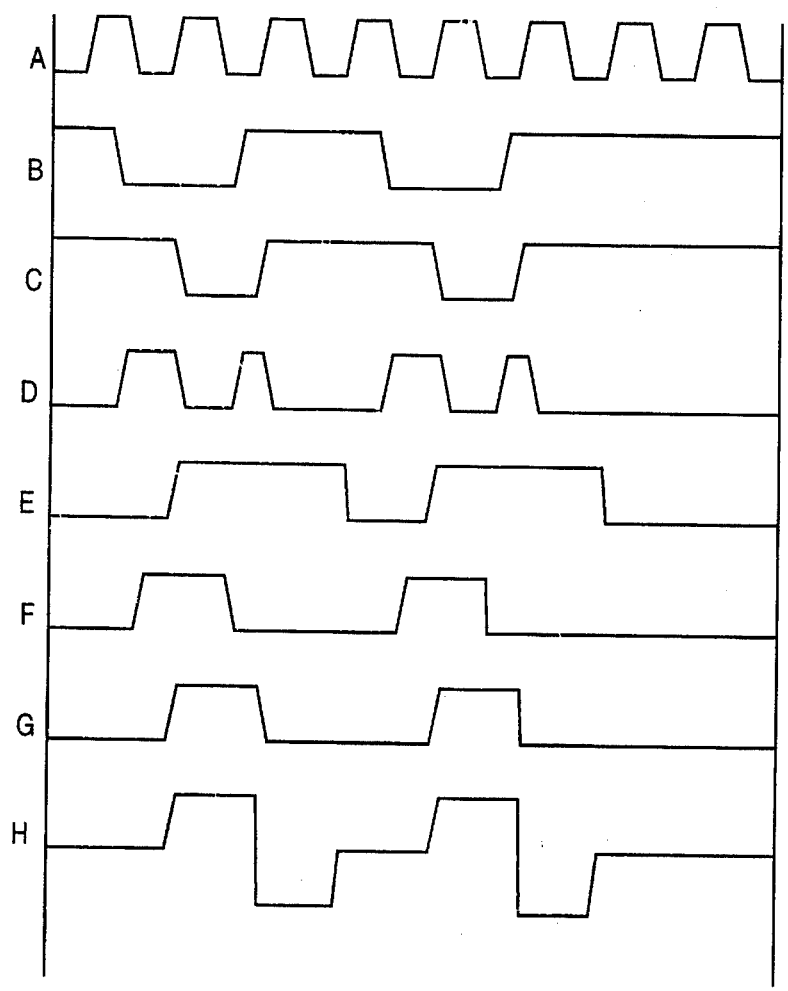
FIG. 4 illustrates in timing diagram form the operation of the phase detector of FIG. 3.

FIG. 4 illustrates in timing diagram form the operation of the phase detector of FIG. 3. Waveforms A, B, C, D, E, F, G and H respectively represent the signals on the local clock, node 250, the Q terminal of D-type flip-flop 230, node 283, node 281, the Q terminal of D-type flip-flop 211, node 282 and node 260. FIG. 4 illustrates waveforms for the phase detector of FIG. 3 when the transition edge of the data signal on node 250 is first slightly ahead of the transition edge of the local clock, then slightly behind of the transition edge of the local clock, then slightly ahead of the transition edge of the local clock, then slightly behind of the transition edge of the local clock.

As illustrated in FIG. 4, when a transition edge is detected in the data signal on node 250 (waveform B), circuitry 200 outputs on node 281 a pulse after the transition edge of the data signal that is independent of the transition edge polarity (waveform E). The pulse has a width of approximately one clock period. Circuitry 210 outputs on node 182 a first signal state e.g. a logical-one, after the transition edge of the data signal when the transition edge of the data signal is ahead of the transition edge of the local clock and outputs a second signal state e.g. a logical-zero, when the transition edge of the data signal is behind the transition edge of the local clock (waveform G). Circuitry 220 receives the signals on node 281 and node 282, combines the signals, and outputs on node 260 a pump-up pulse, a pump-down pulse or no pulse (waveform H). Circuitry 220 outputs on node 260 a pump-up pulse when the transition edge of the data signal is ahead of the transition edge of the local clock, a pump-down pulse when the transition edge of the data signal is behind the transition edge of the local clock and no pulse when no transition edge of the data signal exists. The pump-up pulse and the pump-down pulse have a width of approximately one clock period.

D-type flip-flop 230 samples and retimes the data signal on node 250 (waveform C). D-type flip-flop 230 outputs to the first input terminal of XOR gate 240 this sampled data signal. XOR gate 240 exclusive-ORs the sampled signal on the Q terminal of D-type flip-flop 230 with the data signal on node 250. XOR gate 240 as a result outputs on node 283 a pulse of known polarity after every transition edge on node 250 that is independent of the transition edge polarity (waveform D).

Waveform C refers to the sampled or retimed data signal on the Q terminal of D-type flip-flop 230. Because D-type flip-flop 230 is clocked off the rising transition edge of the local clock and because the transition edge of the data signal occurs near the falling transition edge of the local clock, the sampled data signal from D-type flip-flop 230 resembles the data signal on node 250 except that it is delayed by approximately one-half clock period.

Waveform D refers to the output signal of XOR gate 240. XOR gate 240 exclusive-ORs the data signal on node 250 with the sampled data signal from D-type flip-flop 230. In the example illustrated, with the transition edge of the data signal occurring near the failing transition edge of the local clock, XOR gate 240 outputs a pulse for each transition edge in the data signal because the sampled data signal from D-type flip-flop 230 is a one-half clock period delayed version of the data signal. Each pulse is generated shortly after each transition edge of the data signal and has a pulse width of approximately one-half clock period.

Waveform E refers to the sampled or retimed data signal on the Q terminal of D-type flip-flop 201. D-type flip-flop 201 is clocked off the rising transition edge of the local clock and outputs a pulse for each pulse generated by XOR gate 240. The pulse from D-type flip-flop 201 has a pulse width of approximately one clock period and begins near the falling transition edge of the pulse from XOR gate 240. Thus, the pulse from D-type flip-flop 201 is delayed by one-half clock period when compared to the pulse from XOR gate 240. When compared to the data signal on node 250, the pulse from D-type flip-flop 201 is generated one-half clock period after each transition edge in the data signal. However as shown in the example, only one pulse from D-type flip-flop 201 is generated for two transition edges. In the example, the falling transition edge and the rising transition edge of the data signal are spaced one clock period apart. Thus, because D-type flip-flop 201 is clocked off once every clock period during the rising transition edge of the local clock, the two pulses of one clock period each in effect becomes combined into one pulse of two clock periods. In the situation where the falling transition edge and the rising transition edge of the data signal are spaced two or more clock periods apart, D-type flip-flop 201 generates two distinct pulses of one clock period each. In this manner, D-type flip-flop 201 generates a pulse when the phase detector receives a transition edge in the data signal.

In addition, as illustrated in the example, when the data signal remains in the same signal state for two rising transition edges of the local clock or more, a gap of at least one clock period appears between pulses from XOR gate 240 and a gap appears between pulses from D-type flip-flop 201.

Waveform F refers to the sampled or retimed data signal on the Q terminal of D-type flip-flop 211. D-type flip-flop 211 is clocked off the falling transition edge of the local clock and generates a first signal state e.g. a logical-one when the pulse from XOR gate 240 rises before the falling transition edge of the local clock. D-type flip-flop 211 generates a second signal state when the pulse from XOR gate 240 rises after the falling transition edge of the local clock or when no pulse exists near the falling transition edge of the local clock. Because the rising transition edge of the pulse signal from XOR gate 240 is derived from the transition edge of the data signal, when the transition edge of the data signal occurs before the falling transition edge of the local clock, D-type flip-flop 211 generates a first signal state. Likewise, when the transition edge of the data signal occurs after the falling transition edge of the local clock, D-type flip-flop 211 generates a second signal state.

Waveform G refers to the sampled or retimed data signal on the Q terminal of D-type flip-flop 212. Because D-type flip-flop 212 is clocked off during the rising transition edge of the local clock and because the transition edges of the sampled data signal of D-type flip-flop 212 occur near the falling transition edge of the local clock, the sampled data signal of D-type flip-flop 212 resembles the sampled data signal of D-type flip-flop 211 except that it is delayed by one-half clock period. This delay allows the alignment of the output signal from circuitry 200 with the output signal from circuitry 210. In this manner, D-type flip-flop 212 generates a first signal state when the transition edge of the data signal occurs before the falling transition edge of the local clock and generates a second signal state when the transition edge of the data signal occurs after the falling transition edge of the local clock.

Waveform H refers to the output signal of circuitry 220. When circuitry 200 outputs a pulse, circuitry 220 outputs a first voltage potential, when circuitry 210 also outputs a first signal state. When circuitry 210 outputs a second signal state while circuitry 200 outputs a pulse, circuitry 220 outputs a second voltage potential. On the other hand, when circuitry 200 does not output a pulse, circuitry 220 outputs a third voltage potential regardless of the output of circuitry 210. In this manner, circuitry 220 generates a first voltage potential when the transition edge of the data signal occurs before the falling transition edge of the local clock, generates a second voltage potential when the transition edge of the data signal occurs after the falling transition edge of the local clock, and generates a third voltage potential when the data signal remains in the same signal state for two rising transition edges of the local clock or more.

Figure 5:
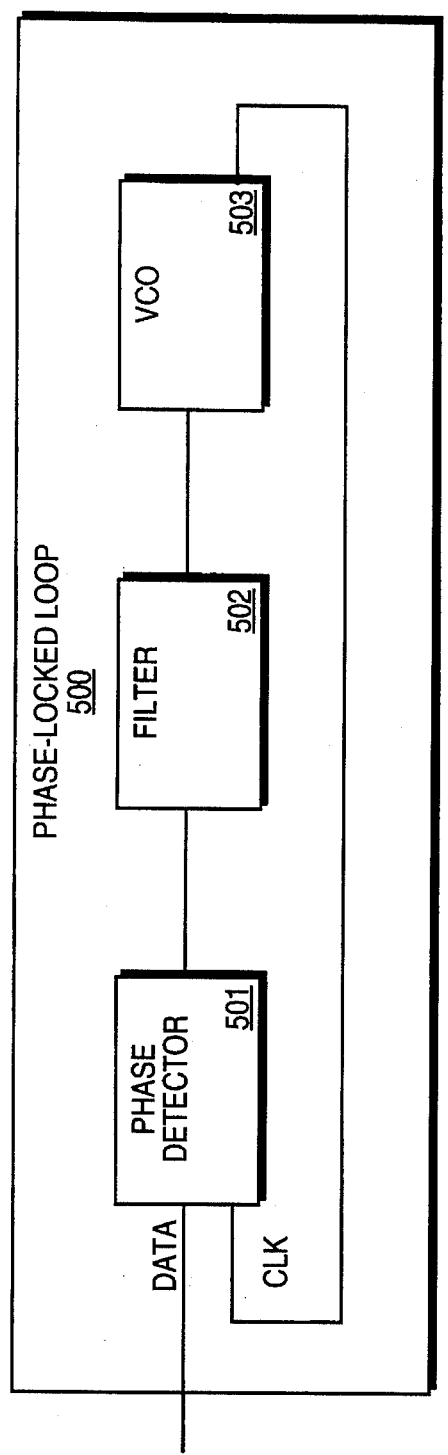
FIG. 5 illustrates in block diagram form a phase-locked loop circuit of an application of an embodiment of the present invention.

FIG. 5 illustrates in block diagram form a phase-locked loop circuit of an application of an embodiment of the present invention. Phase-locked loop (PLL) circuit 500 comprises phase detector 501, filter 502 and clock generator 503. PLL circuit 500 also comprises a data input coupled to phase detector 501. The data input allows phase detector 501 to receive a data signal from an external component or an external circuit in the same component or the same chip. Phase detector 501 is also coupled to a local clock line from clock generator 503 allowing phase detector 501 to receive a local clock signal from clock generator 503. In addition, phase detector 501 is coupled to filter 502 which is in turn coupled to clock generator 503. Phase detector 501 generates a first signal when the transition edge of the local clock occurs after the transition edge of the data signal. It generates a second signal when the transition edge of the local clock occurs before the transition edge of the data signal and it generates a third signal when the data signal remains in the same signal state for at least two transition edges of the same type of the local clock. The two transition edges can be falling transition edges or rising transition edges. By remaining in the same signal state, the data signal remains a logical-one or a logical-zero. The first signal can be a first voltage potential. The second signal can be a second voltage potential, and the third signal can be a third voltage potential. The circuit just described is a ternary system with three voltage levels: first, second, and third. The first signal, second signal or third signal is transmitted by phase detector 501 to filter 502. Alternatively, the first signal can be a combination of a plurality of digital signals e.g., a logical-one and a logical-one. The second signal can be a logical-one and a logical-zero. The third signal can be a logical-zero and a logical-one or a logical-zero and a logical-zero. Phase detector 501 may compare the data signal with either rising or faling edge of the clock signal.

Filter 502 is used to shape the overall response of the PLL circuit to meet the design goals of the system. In this manner, filter 502 controls the PLL circuit dynamics and the performance of the system. Filter 502 transmits the first signal, second signal or third signal to clock generator 503. Clock generator 503 in this embodiment, is a voltage-control-oscillator (VCO). Clock generator 503 generates a local clock to phase detector 501. Clock generator 503 accelerates the local clock to phase detector 501 in response to the first signal. Clock generator 503 delays the local clock signal to phase detector 501 in response to the second signal and maintains the local clock to phase detector 501 in response to a third signal. In this embodiment, clock generator 503 accelerates the local clock by increasing the frequency of the local clock and delays the local clock by decreasing the frequency of the local clock. Alternatively, clock generator 503 can accelerate the local clock by shifting in the phase of the local clock and delay the local clock by shifting out the phase of the local clock.

When there is a long period interval between transition edges in the data signal, it is desirable for a PLL circuit to neither accelerate or delay the local clock because no comparison of the data transition edges to the clock transition edges can be made and any phase detector output will likely introduce error. In this manner, PLL circuit 500 exhibits enhanced run-length tolerance. During a long period interval between data transition edges, phase detector 501 generates the third signal and clock generator 503 maintains the local clock. Unlike the prior non-linear system, PLL circuit 500 does not accelerate or delay the local clock during long run-lengths and thus, exhibits enhanced run-length tolerance. In addition, PLL circuit 500 decreases the amount of error introduced into the system by maintaining the local clock during long run-lengths. Consequently, jitter is also reduced.

Figure 6:
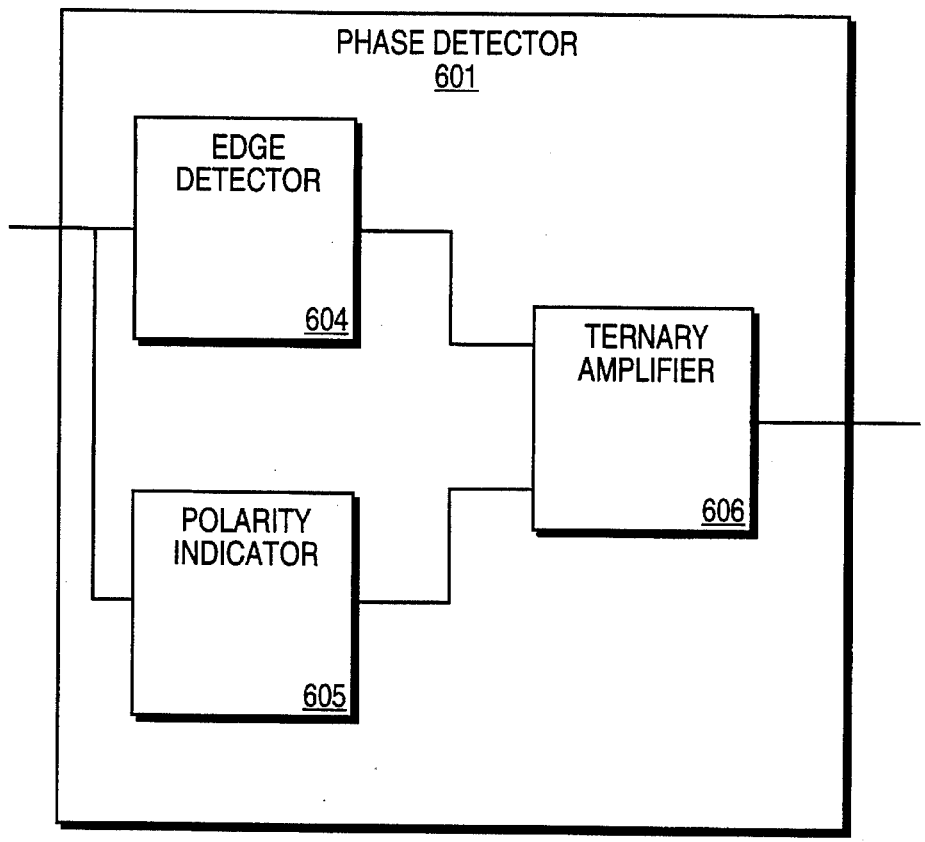
FIG. 6 illustrates in block diagram form a phase detector of a symbolic embodiment of the present invention.

FIG. 6 illustrates in block diagram form a phase detector of a symbolic embodiment of the present invention. Phase detector 601 comprises presence indicator 604, polarity indicator 605 and ternary amplifier 606. Phase detector 601 also comprises a data input which allows phase detector 601 to receive a data signal from a data signal source and comprises a clock input allowing phase detector 601 to receive a local clock signal from a local clock source e.g. clock generator 503. Presence indicator 604 is coupled to the data input and the clock input. Presence indicator 604 indicates the transition edge of the data signal. Presence indicator 604 indicates the transition edge of the data signal by generating a first signal state when phase detector 601 receives the edge of the data signal and generating a second signal state when the data signal received by phase detector 601 remains in the same signal state for at least two transition edges of the same type of the local clock. Polarity indicator 605 is coupled to the data input and the clock input. Polarity indicator 605 indicates the position of the transition edge of the data signal relative to the transition edge of the local clock. The transition edge of the local clock used for this comparison can be a rising transition edge or can be a falling transition edge. Polarity indicator 605 indicates the position of the transition edge of the data signal by generating a first signal state when the transition edge of the data signal occurs before the transition edge of the local clock and generates a second signal state when the transition edge of the data signal occurs after the transition edge of the local clock.

Ternary amplifier 606 is coupled to presence indicator 604 and polarity indicator 605. Ternary amplifier 606 generates a first signal when the transition edge of the clock signal occurs after the transition edge of the data signal. Ternary amplifier 606 generates the second signal when the transition edge of the clock signal occurs before the transition edge of the data signal and generates the third signal when the data signal remains in the same signal state for at least two transition edges of the same type of the local clock. Alternatively, ternary amplifier 606 generates the first signal when presence indicator 604 and polarity indicator 605 generate a first signal state e.g. a logical-one. Ternary amplifier 606 generates the second signal when presence indicator 604 generates a first signal state and polarity indicator 605 generates a second signal state. Ternary amplifier 606 generates the third signal when presence indicator 604 generates a second signal state e.g. a logical-zero. Under yet an alternative embodiment, phase detector 601 does not have ternary amplifier 606. Instead, presence indicator 604 and polarity indicator 605 are coupled to clock generator 503 through filter 502.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, a method and apparatus for controlling a clock generator has been described.

What is claimed is:

1. A method for controlling a clock generator comprising:

generating a clock signal;

receiving a data signal from an external circuit;

generating a first polarity signal when a transition edge of said clock signal occurs after a transition edge of said data signal;

generating a second polarity signal when said transition edge of said clock signal occurs before said transition edge of said data signal; and generating a presence signal when said data signal remains in a same signal state for at least two transition edges of a same type of said clock signal.

2. A method for controlling a clock generator comprising:

generating a clock signal;

receiving a data signal from an external circuit;

generating a first signal when a transition edge of said clock signal occurs after a transition edge of said data signal;

generating a second signal when said transition edge of said clock signal occurs before said transition edge of said data signal; and generating a third signal when said data signal remains in a same signal state for at least two transition edges of a same type of said clock signal, said third signal enabling one of said first and second signals to modify said clock signal, said first signal and said second signal representing, respectively, a first and a second state of a polarity function.

3. A method for controlling a clock generator comprising:

generating a clock signal;

receiving a data signal from an external circuit;

generating a signal having a first state, a second state and a third state, said first state occurring when a transition edge of said clock signal occurs after a transition edge of said data signal, said first state representing a first polarity value;

said second state occurring when said transition edge of said clock signal occurs before said transition edge of said data signal, said second state representing a second polarity value; and said third state occurring when said data signal remains in a same signal state for at least two transition edges of a same type of said clock signal, said third state not modifying said clock signal.

4. A phase-locked loop circuit comprising:

a clock generator operable to accelerate a clock signal in response to a first signal, operable to delay said clock signal in response to a second signal, and operable to maintain said clock signal in response to a third signal;

a phase detector coupled to a said clock generator operable to generate said first signal when a transition edge of said clock signal occurs after a transition edge of a data signal, wherein said phase detector is operable to generate said second signal when said transition edge of said clock signal occurs before said transition edge of said data signal, and wherein said phase detector is operable to generate said third signal when said data signal remains in a same signal state for at least two transition edges of a same type of said clock signal, said third signal enabling one of said first and second signals to modify said clock signal, said first signal and said second signal representing respectively a first and second state of a polarity function; and a data input coupled to said phase detector allowing said phase detector to receive said data signal from an external circuit.

* * * * *